(12) United States Patent
Hamouz et al.

(10) Patent No.: US 11,624,761 B2
(45) Date of Patent: Apr. 11, 2023

(54) FAULT DETECTION FOR APPLIANCES BASED ON ENERGY CONSUMPTION DATA

(71) Applicant: Centrica PLC, Windsor (GB)

(72) Inventors: Miroslav Hamouz, Berkshire (GB); Giuseppe Vettigli, Berkshire (GB)

(73) Assignee: Centrica PLC, Windsor (GB)

( * ) Notice: Subject to any disclaimer, the term of this patent is extended or adjusted under 35 U.S.C. 154(b) by 0 days.

(21) Appl. No.: 17/126,708

(22) Filed: Dec. 18, 2020

(65) Prior Publication Data

US 2021/0190837 A1   Jun. 24, 2021

(30) Foreign Application Priority Data

Dec. 20, 2019   (GB) .................................... 1919011

(51) Int. Cl.
| | | |
|---|---|---|
| *G01R 21/133* | (2006.01) | |
| *G01R 19/25* | (2006.01) | |
| *G01R 22/06* | (2006.01) | |
| *G06Q 50/06* | (2012.01) | |

(52) U.S. Cl.
CPC ....... *G01R 21/133* (2013.01); *G01R 19/2513* (2013.01); *G01R 22/068* (2013.01); *G06Q 50/06* (2013.01)

(58) Field of Classification Search
CPC .............. G01R 21/133; G01R 19/2513; G01R 22/068; G06Q 50/06
See application file for complete search history.

(56) References Cited

U.S. PATENT DOCUMENTS

| | | | |
|---|---|---|---|
| 8,086,355 B1 * | 12/2011 | Stanczak ................ | H02H 3/006 |
| | | | 700/286 |
| 2011/0301894 A1 | 12/2011 | Sanderford, Jr. | |
| 2013/0066479 A1 * | 3/2013 | Shetty .................... | G01D 4/002 |
| | | | 706/45 |
| 2015/0094965 A1 * | 4/2015 | Schneider ................ | H02H 6/00 |
| | | | 702/58 |

(Continued)

FOREIGN PATENT DOCUMENTS

| | | | |
|---|---|---|---|
| KR | 101642044 B1 * | 7/2016 | |
| KR | 101642044 B1 | 7/2016 | |

(Continued)

OTHER PUBLICATIONS

United Kingdom Combined Search and Examination Report, corresponding to United Kingdom Application No. GB1919011.5 dated Jun. 4, 2020, 5 pages.

(Continued)

*Primary Examiner* — Yoshihisa Ishizuka
(74) *Attorney, Agent, or Firm* — Tucker Ellis LLP; Michael G. Craig (57) ABSTRACT

A method of detecting a fault in a device is described. The method comprises receiving an energy consumption signal for the device, the energy consumption signal indicating a varying energy consumption of the device over time during operation of the device. A basis function is selected, the basis function defining a signal pattern associated with a known fault type. A correlation between the basis function and the energy consumption signal is evaluated. Presence of an operating fault in the device is determined in dependence on the correlation, and an output is generated based on the determination.

19 Claims, 11 Drawing Sheets

(56) References Cited

U.S. PATENT DOCUMENTS

2016/0091540 A1  3/2016 Marti et al.
2019/0079173 A1* 3/2019 Kutej .................... B06B 1/0215

FOREIGN PATENT DOCUMENTS

WO   2010141826 A2   12/2010
WO   2016006977 A1   1/2016

OTHER PUBLICATIONS

Cernazanu et al., "Anomaly Detection Using Power Signature of Consumer Electrical Devices," Advances in Electrical and Computing Engineering, Jun. 8, 2020, 6 pages, vol. 15, No. 1, Timisoara, Romania.
Dew Hurst et al., "The Shocklet Transform: A Decomposition Method for the Identification of Local, Mechanism-Driven Dynamics in Sociotechnical Time Series," Physics.sos-ph, Jun. 27, 2019, 12 pages, DOI: arXiv:1906.11710v1.
European Communication from corresponding European Patent Application No. 20215826.7, dated May 3, 2021, 11 pages.

\* cited by examiner

FAULT DETECTION FOR APPLIANCES BASED ON ENERGY CONSUMPTION DATA

CROSS-REFERENCE TO RELATED APPLICATIONS

This application claims priority to United Kingdom Patent Application No. 1919011.5, entitled FAULT DETECTION FOR APPLIANCES BASED ON ENERGY CONSUMPTION DATA, filed Dec. 20, 2019, which is incorporated herein by reference.

BACKGROUND

Heating, Ventilation and Air Conditioning (HVAC) appliances are used to maintain comfortable environmental conditions in homes and other buildings. However, these are typically expensive devices, and maintenance and repair costs can also be high. In principle, early fault detection and prevention of critical faults could reduce the risk of the owner facing an expensive repair bill or even system replacement. However, it can often be difficult to spot developing faults in advance of catastrophic failure (e.g. boiler breakdown).

SUMMARY

Accordingly, embodiments of the invention seek to provide approaches for allowing earlier detection of faults in HVAC and other appliances.

An aspect of the invention provides a computer-implemented method of detecting a fault in a device, comprising:
receiving an energy consumption signal for the device, the energy consumption signal indicating a varying energy consumption of the device over time during operation of the device;
selecting at least one basis function, wherein the basis function defines a signal pattern associated with a known fault type;
evaluating a correlation between the at least one basis function and the energy consumption signal;
determining presence of an operating fault in the device in dependence on the correlation; and
generating an output based on the determination.

The energy consumption signal preferably comprises a time series of energy consumption values extending over a given time period, the evaluating step comprising evaluating a correlation between the basis function and the energy consumption signal at each of a plurality of times or time windows of the energy consumption signal. Preferably, the method comprises computing a time series of intensity values, each intensity value indicative of a strength of correlation between the basis function and the energy consumption signal at a respective time or time window. The method may comprise computing a respective intensity value for each of a plurality of time instants based on a correlation of the basis function when centred at a respective time instant, optionally wherein a width of the basis function defines a time window of the energy consumption signal over which correlation is evaluated.

Basis functions may be defined e.g. by way of a mathematical or algorithmic specification. In one example, basis functions may be specified by specifying one or more parameter(s) for one or more predetermined basis function forms. However, a basis function could be specified in any suitable way, e.g. as a series of data points. The selected basis function may be a predetermined basis function or may be selected from a set of predetermined basis functions.

The method may comprise: analysing the intensity values to identify one or more intensity values meeting a detection criterion; and in response to identifying one or more intensity values meeting the detection criterion, detecting an operating fault of the known fault type, or in response to identifying no intensity values meeting the detection criterion, identifying that the fault is not present. The detection criterion is preferably based on comparison of the intensity values to a comparison threshold, and may comprise at least one intensity value exceeding the comparison threshold, optionally by at least a predetermined margin.

Evaluating a basis function preferably comprises repeating the evaluation while varying one or more parameters of the basis function, the (or each) parameter preferably varied over a (respective) predefined set of parameter values, such as a parameter range or set of ranges. Note that, wherever reference is made herein to a (parameter) range this may include both a set of values for the parameter (e.g. as a set of explicitly defined distinct values) or a range defined through range bounds, e.g. minimum and maximum values for the parameter (a step size for evaluation may in that case be specified explicitly or may be assumed implicitly/predetermined). The one or more parameters may comprise one or more of: a width parameter indicating a width of the basis function and/or signal window over which correlation is performed; and a shape parameter controlling a shape of the basis function. The method may comprise computing a representative correlation intensity, optionally an average or maximum correlation intensity, over a range of variation of one or more basis function parameters. The method may comprise determining, for each of a plurality of values of a first parameter, optionally a shape parameter, a representative correlation intensity, optionally an average or maximum correlation intensity, over a range of variation of a second parameter, optionally a width parameter.

Preferably, the method comprises repeating the evaluation for each of a plurality of fault types, using one or more respective predetermined basis functions defined for each respective fault type, to detect presence or absence of each of the fault types. The outputting step may comprise, in response to detection of a given fault type based on correlation of a basis function associated with the given fault with the energy consumption signal, outputting an indication of the detected fault type.

Preferably, evaluating a correlation between the at least one basis function and the energy consumption signal comprises computing one or more measures of correlation between the basis function and the energy consumption signal, and comparing the measure(s) against one or more comparison values, the comparison value(s) preferably having been established based on energy consumption of a non-faulty device.

The method preferably further comprises establishing comparison values for use in performing the fault detection based on a reference energy consumption signal of a device operated in the absence of a fault. The method may comprise, for a given fault type, or for each given fault type of a plurality of fault types: evaluating a basis function associated with the given fault type against the reference energy consumption signal, preferably by determining one or more correlation intensities indicating strength of correlation between the basis function and the reference energy consumption signal; and determining a comparison value for the fault type based on the evaluation.

Determining one or more correlation intensities may comprise determining a time series of correlation intensities indicating strength of correlation between the basis function and the reference energy consumption signal at each of a plurality of times or time windows of the energy consumption signal. The method may comprise determining a comparison value based on the time series of correlation intensities, preferably by selecting or computing a representative correlation intensity, optionally a maximum or average correlation intensity, from the time series of correlation intensities. Evaluating a basis function against the reference energy consumption signal may comprise varying one or more basis function parameters, optionally over predetermined parameter ranges to determine representative (optionally maximum or average) correlation intensities. The comparison value(s) may be stored (e.g. with the relevant basis functions) for later use in fault detection.

Detection of a fault is then preferably performed based on comparing the comparison value obtained using the reference energy consumption signal to correlation intensities determined for the energy consumption signal.

Preferably, the outputting step comprises one or more of: transmitting an electronic message indicating presence or absence of the fault and/or the detected fault type to a user device; and transmitting a control signal to the device or a control system associated with the device to deactivate the device or change an operating state or operating configuration of the device.

The method may further comprise receiving user input for configuring, for one or more fault types, one or more of: at least one basis function suitable for detecting the fault type; one or more ranges or limits for one or more parameters of a basis function; one or more detection criteria for the fault type, optionally comprising detection thresholds or margins; and preferably wherein the evaluation is performed in accordance with the configured information. The method may comprise maintaining a database of fault types optionally with one or more of: basis functions, basis function parameter ranges or limits; and detection criteria, the evaluation performed using the database.

The energy consumption signal and/or reference energy consumption signal preferably comprise electricity consumption signals, optionally measured using an electricity consumption measurement device such as a current clamp. However, the described methods may be applied to other forms of energy consumption (e.g. natural gas or other combustible fuels).

The method may be performed at a computing system remote from the device, the method optionally comprising receiving the energy consumption signal from a measurement device associated with the device over a network connection. The method may comprise receiving a plurality of energy consumption signals at the computing system over the network for a plurality of monitored devices, and performing the fault detection for each of the plurality of devices. The fault detection may be performed periodically based on periodically received consumption signals from one or more devices. The devices may be HVAC appliances or other household appliances.

In a further aspect of the invention, there is provided a computer-implemented method of detecting a fault in a device, comprising:

receiving an energy consumption signal for the device, the energy consumption signal indicating a varying energy consumption of the device over time during operation of the device;

selecting a basis function defining a signal pattern associated with a known fault type, wherein the basis function comprises a windowed function and is parameterized by at least one parameter, the at least one parameter comprising one or more of: a width parameter indicating a width of the basis function and/or signal window over which correlation is performed; and a shape parameter controlling a shape of the basis function;

evaluating a correlation between the basis function and the energy consumption signal;

determining presence of an operating fault in the device in dependence on the correlation; and generating an output based on the determination.

Evaluating the basis function may comprise repeating the evaluation while varying one or more of the parameters of the basis function, each parameter preferably varied over a respective predefined set or range of parameter values. The method in this aspect may include any of the further steps or features of the method aspect set out above.

The invention also provides a computer system or computing device having means for performing any method as set out herein, the means optionally comprising one or more processors with associated storage storing software code executable by the processor(s) to perform the method. The invention further provides a non-transitory computer readable medium comprising software code adapted, when executed on one or more data processing devices, to perform any method as set out herein.

More generally, the described methods are preferably computer-implemented, using software running on one or more processing devices. However, features implemented in software may generally be implemented in hardware, and vice versa. Any reference to software and hardware features herein should be construed accordingly.

Any feature in one aspect of the invention may be applied to other aspects of the invention, in any appropriate combination. In particular, method aspects may be applied to apparatus and computer program aspects, and vice versa.

DESCRIPTION OF THE DRAWINGS

Preferred features of the present invention will now be described, purely by way of example, with reference to the accompanying drawings, in which.

DETAILED DESCRIPTION

Figure 1:
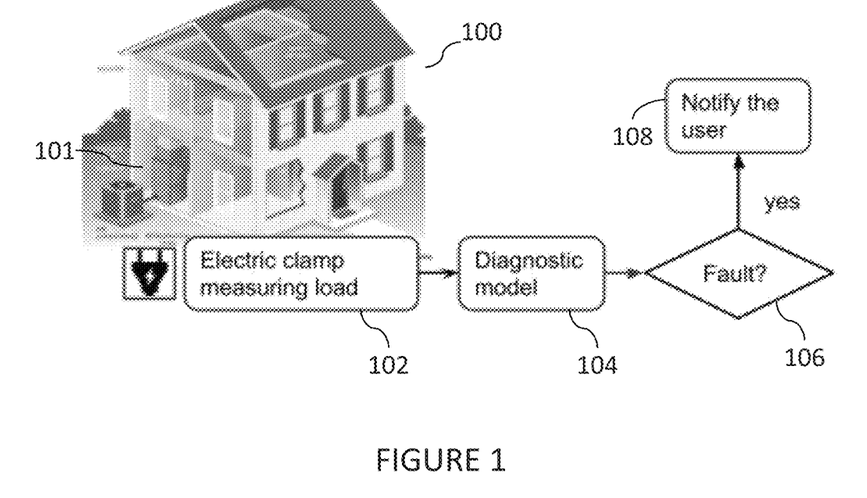
FIG. 1 illustrates a system for HVAC fault detection in overview.

FIG. 1 illustrates in overview a system for diagnosing faults in HVAC units. The illustration shows a house or other building 100 including one or more HVAC units, such as boilers, furnaces, air conditioners etc. The following discussion focusses on a single representative HVAC device or system 101, but it will be understood that the described methods may be applied to multiple devices/systems in a single property and/or across multiple properties.

The electrical load is measured and recorded with a suitable measurement device such as a current clamp 102 installed on the supply to the monitored HVAC system 101, producing (possibly after pre-processing) a time series signal of electricity consumption data, and the data is sent to a processing device where the disclosed diagnostic method is applied. The processing device applies a diagnostic model 104 to the electricity consumption data and checks if a fault is detected (106). If a fault is detected (108), a user is notified, for example via an electronic message or notification (e.g. delivered to a smartphone or other user device or displayed in a monitoring application), an update to a status display in the house or the like.

The processing device may be a cloud-based computing server. Such a centralised processing solution can enable large sets of HVAC units to be monitored regularly (or quasi-continuously) without human intervention. In turn, the diagnostic processes can enable:

Notification of users as soon as a faulty behaviour is detected.

Identifying to the user what type of fault occurred and possibly what remedial action is needed or recommended.

The diagnostic process is based on the fact that different types of faults are reflected in different patterns of anomalous behaviour of the power consumption of the HVAC unit. The anomalous consumption patterns are represented by different basis functions that are compared to the consumption signal. Each basis function defines a signal pattern associated with a particular fault type. By matching a particular basis function to the signal, the diagnostic method can raise an alert identifying a specific fault type corresponding to the matched basis function and possibly providing information and instructions for addressing the fault. For example, if the method raises an alert using a basis function associated with a faulty capacitor, the system can report to the user that the capacitor needs to be replaced.

Figure 2:
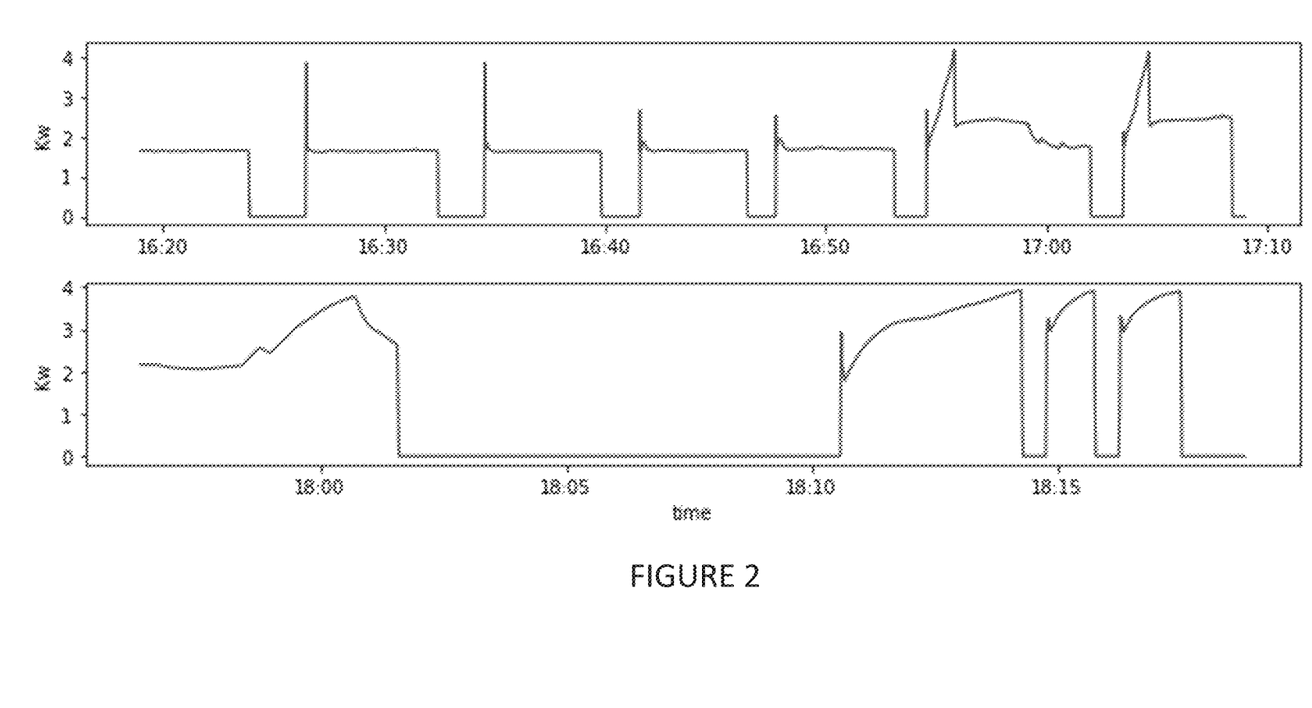
FIG. 2 illustrates a power consumption signal of a compressor of an HVAC unit during normal operation and fault scenarios.

FIG. 2 illustrates, by way of example, the power consumption of a compressor of an HVAC unit (shown as a time series of energy consumption measured in kW). In the upper graph, the first two cycles are recorded under normal circumstances (healthy operation) up to around time point 16:40. Each cycle exhibits an initial spike and then consumption stabilizes. The last four cycles are recorded with the device operating with a faulty/degraded capacitor with decreasing capacitance. The lower graph shows another case of faulty behaviour, with three cycles after time point 18:10 being recorded with the device operating with a worn contactor on the air handler. In both faults the consumption increases more slowly than usual and with different patterns according to the type and the severity of the fault. In both cases, the unit is able to turn on and operate, but the faults result in inefficient behaviour in terms of consumption and may shorten the lifespan of the appliance.

The particular faults illustrated are merely examples, and many other types of faults may be reflected in the energy consumption pattern of a device.

Fault Detection Method

Since the faulty consumption pattern depends on the type and the severity of the fault it is generally not possible to apply a simple pattern matching approach to the observed consumption shapes.

To overcome this problem the present system cross-correlates the consumption signal with a set of basis functions that are similar to consumption patterns observed for particular faults across a wide range of situations.

The basis functions are generally windowed function (e.g. based on boxcar functions) and are selected prior to fault detection, based on expert knowledge of the error type, a library of past errors or the like. During live fault detection, the basis functions are evaluated against the received consumption signal, in particular by cross-correlating the basis function with the signal, to derive a time series of intensity values indicating a correlation intensity for a given basis function at each point in time. The time series of correlation intensity values is also referred to as a response function. The basis functions are preferably parameterized using one or more parameters, for example determining shape and/or width of the function, and the cross-correlation is performed while varying these parameters. The resulting intensity response function is then checked for peak intensity values (or other indicators) which indicate potential faults.

An advantage of the approach is that while a generic shape of the fault needs to be known (by selecting a suitable basis function), identified variations in timing and/or shape of the fault can be accounted for by the variation in basis function parameter(s). Furthermore, detection of a fault can be simplified to simply identifying a maximum value from the intensity response determined by the correlation.

The approach also allows more complex functions to be built as composites of simple basis functions. Selection of appropriate basis functions and/or parameter values (e.g. W and $\theta$ as discussed below) can result in more pronounced intensity peaks, making it easier to identify changes in the operation of devices and in particular detection of faults. Preferably, at least two parameter values are used to parameterize basis functions, one controlling the shape of the function (e.g. $\theta$ as used below) and the other the width (W as used below). The output correlation intensity may be determined by determining a representative correlation intensity (e.g. an average or maximum value) over the range of variation of one or more of the variable parameter(s), and/or by determining separate correlation intensities for different values of one or more parameters.

Furthermore, multiple different basis functions may be used, each basis function selected to allow detection of a specific type of fault (with each basis function exhibiting characteristics, e.g. shape, which matches the shape of an expected consumption signal with the fault present).

Figure 3:
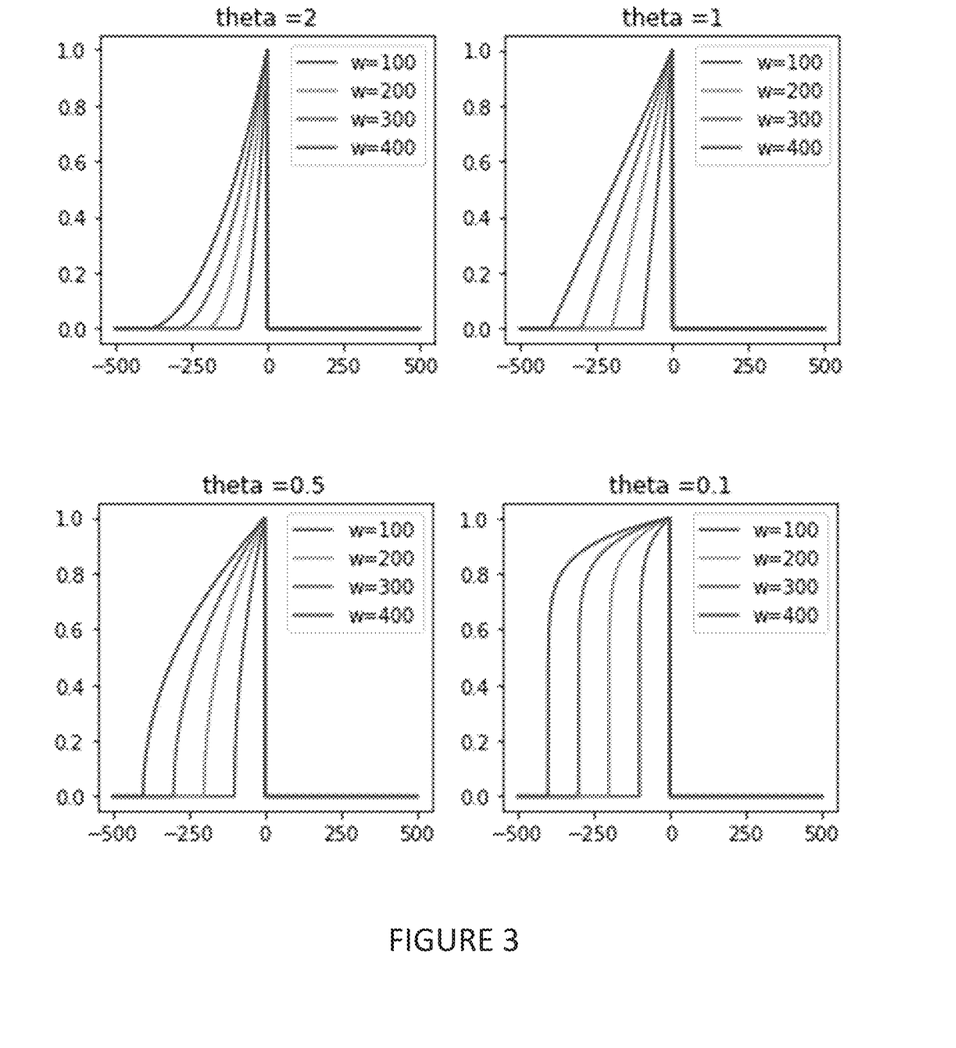
FIG. 3 illustrates basis functions used for fault detection.

FIG. 3 illustrates basis functions that can detect the fault cases shown in FIG. 2. The upper two functions are suitable for detecting the faulty capacitor scenario and the lower two are suitable for detecting the worn contactor.

These basis functions are given by $$y(t|W,\theta) = (\text{rect}(t,W)(t/W+1))^\theta \quad (1)$$

where rect is a boxcar function of length W. The parameter W is the length of the event to detect and the parameter $\theta$ determines the shape of the function and could, for example, be related to the rate of change or rate of growth of the function. The basis functions are preconfigured by a system user and are selected to be appropriate for the faults to be detected. Note that equation (1) above simply provides one example of a suitable basis function form and other definitions may be used.

Figure 4:
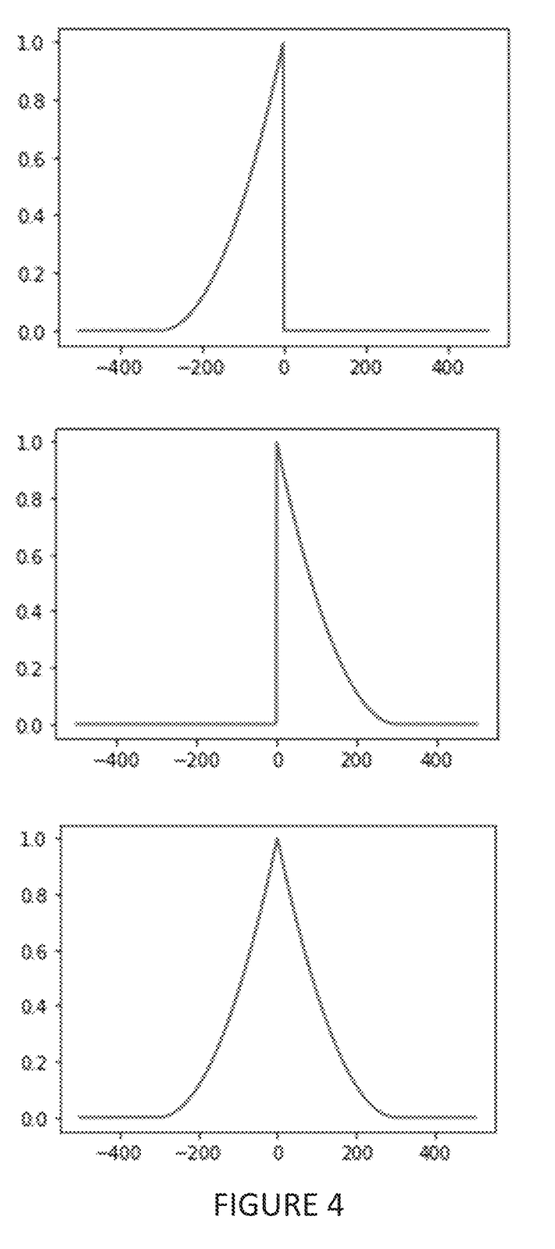
FIG. 4 illustrates combining basis functions for use in fault detection.

FIG. 4 illustrates how to obtain new basis functions by combining the functions obtained with equation 1. The first graph shows the basis function as given by equation (1) with W=300 and θ=2, the second shows the same basis function flipped on the x axis (centre), and the third shows a combination of the first two functions. Note that the derived function depends on the parameters W and θ.

The cross-correlation procedure involves the following steps:
1. Fix θ to a given value.
2. Multiply all the chunks of size W of the input signal by the basis function at each time t, centering the basis function in t (convolution).
3. Average the values obtained for each W.

The values given by the cross-correlation are referred to as response intensities, and these will have higher values when the faulty pattern is present than when it is not present. The cross-correlation process is described further in Dewhurst et al., "The shocklet transform: A decomposition method for the identification of local, mechanism-driven dynamics in sociotechnical time series", 2019, arXiv: 1906.11710v1.

Figure 5A:
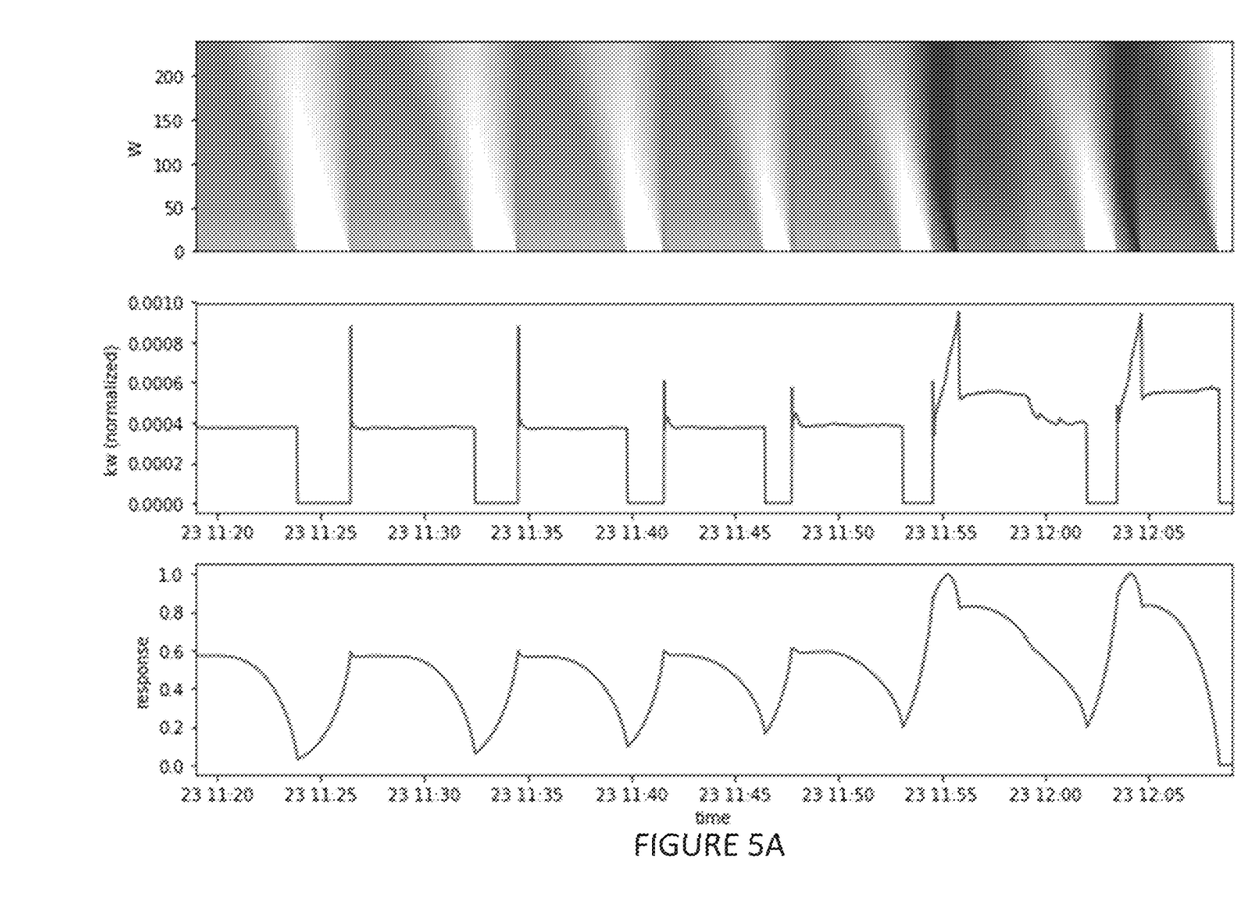
FIG. 5A illustrates input data and processing results for the fault detection process in the presence of a fault, including results of cross-correlation between a basis function and the input signal (top), the original consumption signal (middle) and response intensities (bottom) for $\theta=2$.

The results of the cross-correlation are shown in FIG. 5A, for a device exhibiting faulty or otherwise non-optimal behaviour. At the top, the result of step 2 of the correlation process is shown. The centre graph shows the consumption with the faulty capacitor as shown in FIG. 2 and at the bottom the response intensities are shown, providing a measure of correlation strength. It can be seen where there is a correspondence of the faulty pattern, the map of the top graph shows higher values and the response intensities show a peak.

Figure 5B:
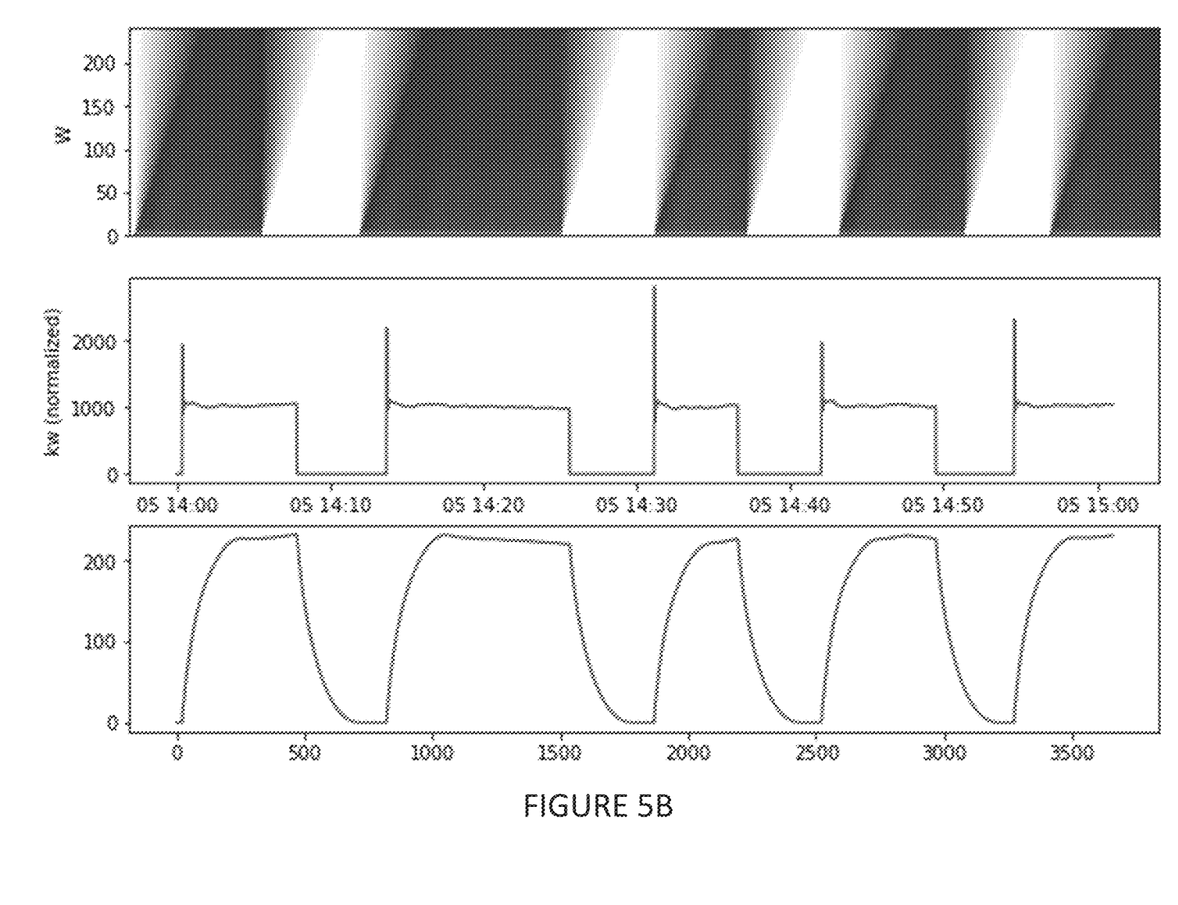
FIG. 5B illustrates similar data in the absence of a fault.

FIG. 5B provides a similar illustration but this time for a device exhibiting normal behaviour. Here, the response has the same level everywhere. The even intensity of shading in the top graph reflects the fact that the intensity response in the bottom graph reaches substantially the same level across the analysed signal. There are no events which exceed that normal maximal level and so no indication of a fault condition.

Fault detection involves two distinct stages. Firstly, in a training stage, comparison baselines are established based on a reference consumption signal. The detection algorithm then runs in a second stage using a live (i.e. recently acquired) consumption signal.

Figure 6:
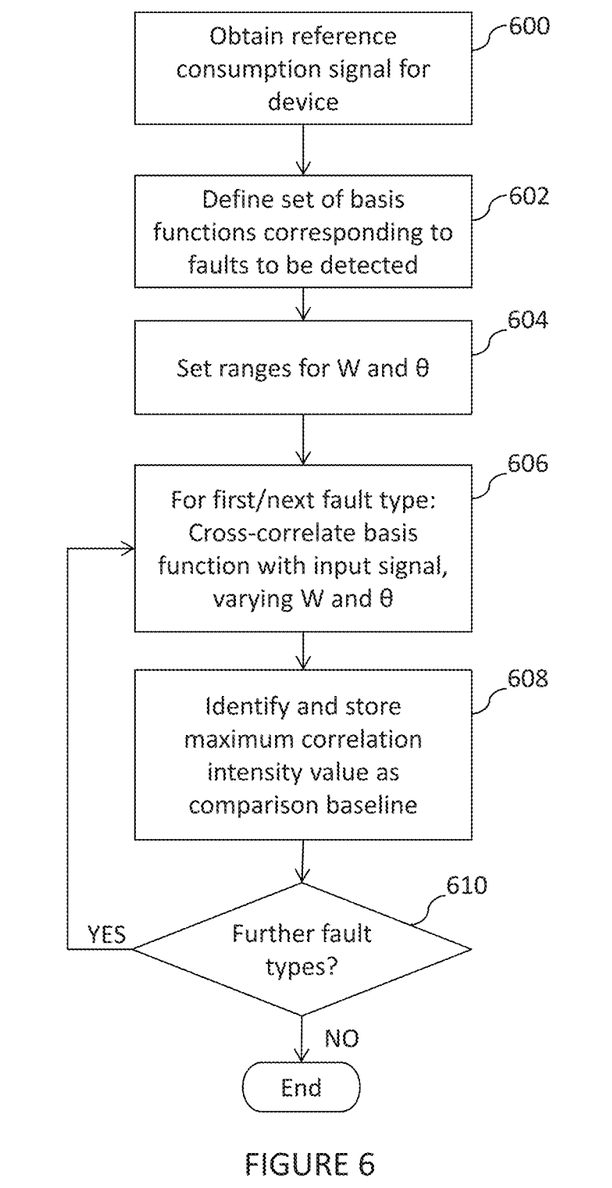
FIG. 6 illustrates a process for deriving comparison baselines for use in detecting faults.

The training stage is illustrated in FIG. 6.

In step 600, the system obtains a reference consumption signal that is representative of healthy operation (i.e. operation in the absence of faults in normal conditions) from the device in question, or from a similar device (e.g. another device of the same type, make and/or model).

In step 602, the basis functions are defined. For example, an operator may select suitable basis functions for particular faults that are of interest for the device in question, e.g. from a database of available basis functions.

In step 604, the operator configures a maximum value for W (with W being varied from 1 i.e. a single sample, or some other predefined minimum width, to the specified maximum value). The operator also configures a range across which θ is to be varied (this could be a continuous range or a predefined set of values to test). The system may suggest default ranges for both parameters for use in the absence of changes configured by the operator.

In step 606, the consumption signal is cross-correlated with a first one of the basis functions, corresponding to a particular fault type. Correlation is performed varying W and θ. For each value of θ, the intensity response function is derived (averaging over correlation intensities for different W as previously set out) and the maximum value is saved in step 608. The maximum value indicates the maximum correlation with that particular basis function (for that value of θ) expected during healthy operation of the device and provides a comparison baseline for fault detection for the particular fault type. This therefore results in a set of saved maximum correlation values (one per value of θ evaluated). If there are further fault types with associated basis functions (test 610), then the process repeats steps 606 and 608 for any further fault types/basis functions.

The process results in a set of comparison baselines for different fault types. While the present description assumes a single type of device being monitored with a set of fault types and associated basis functions, the above process may of course be repeated for any number of device types that are to be monitored, to build up a database of faults, basis functions and comparison baselines for different types of devices.

Figure 7:
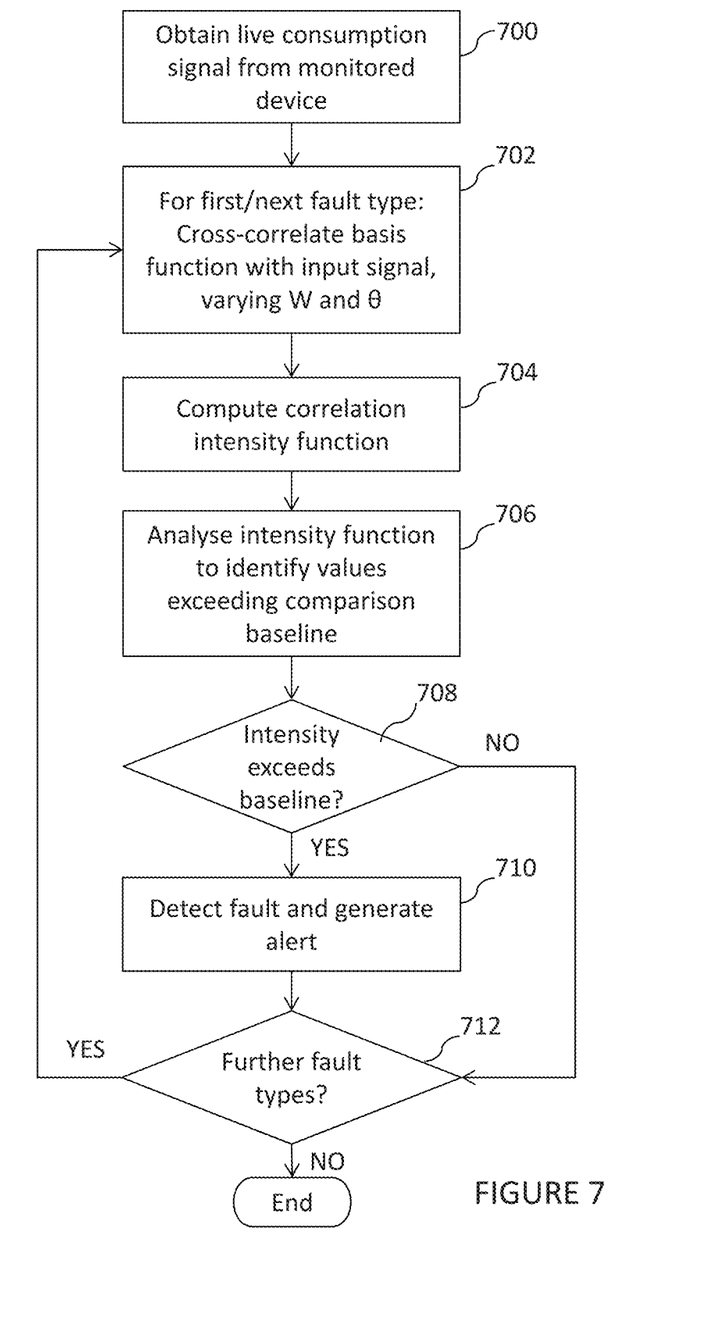
FIG. 7 illustrates a process for fault detection.

The detection stage is illustrated in FIG. 7.

In step 700, a live consumption signal is obtained from a device being monitored. In step 702, for a given fault type and associated basis function, the consumption signal is again cross-correlated with the given basis function while varying W and θ, using the previously described correlation process (the correlation process is fundamentally the same as that performed for baseline establishment in the FIG. 6 process, except applied to a live signal rather than a healthy reference signal).

In step 704, the correlation intensity function is computed for each θ, as the output of the cross-correlation.

In step 706, the values of the intensity function over the processed signal period are analysed (for each value of θ) to identify whether any correlation intensity value of the intensity function exceeds the comparison baseline for the fault type, i.e. the maximum healthy intensity value observed during the training stage, for any value of θ.

If the intensity function is found to exceed the comparison baseline (test 708), a fault corresponding to the fault type for which the given basis function is defined is detected in step 710 and an alert is generated.

Note the above test is repeated for each value of θ in the defined set or range to look for an increase in correlation (indicating fault presence) for each θ value separately. In cases where the shape of the expected fault signal is better known, the range of variation over θ may be smaller, e.g. being restricted to a small number of distinct values (or even a single θ value, removing the need for iteration over θ). Where the shape is less well known/predictable, a wider set or range of θ values may be evaluated.

In a further variation, instead of storing separate maximum correlation values for each distinct θ value under test in the FIG. 6 process, the process may simply store a single value, that being the maximum correlation observed over all θ values tested. The FIG. 7 process would then preferably still iterate the evaluation across the defined θ range to search for any form of the basis function that exceeds the recorded maximum correlation.

Alternative or additional criteria may be applied for fault detection. For example, a threshold margin may be applied in step 706, e.g. to require the intensity function to exceed the maximum observed healthy intensity value by a given margin before the fault is considered detected. The margin could be specified as an absolute or relative threshold.

The detection stage can be repeated for any number of basis functions corresponding to different fault types. Thus, after step 710, or if no fault was detected for the current fault type, the process repeats steps 702-710 while there are further fault types to process (test 712). Once all fault types have been processed, the process ends.

Once the training stage has been carried out, the detection stage may typically be performed repeatedly, e.g. periodically at defined intervals (for example every hour, or more frequently). Detection frequency may vary for different fault types. Each detection run is based on recent values of the consumption signal, e.g. covering a given signal period (e.g. the last 10 seconds or the last minute of consumption data may be processed).

Once a fault has been detected, the user is alerted as previously described. Other actions may be taken, e.g. sending a control signal to remotely deactivate the faulty device or alter its operation configuration/parameters, trigger a diagnostic function of the device etc.

In an embodiment, the system may store a database of fault types, which may include, e.g. the basis function(s) relevant to the fault type, detection criteria e.g. thresholds/margins, a specification of actions to be taken (e.g. user alert) on detection of the fault, alert content (e.g. text message content) and the like.

Figure 8:
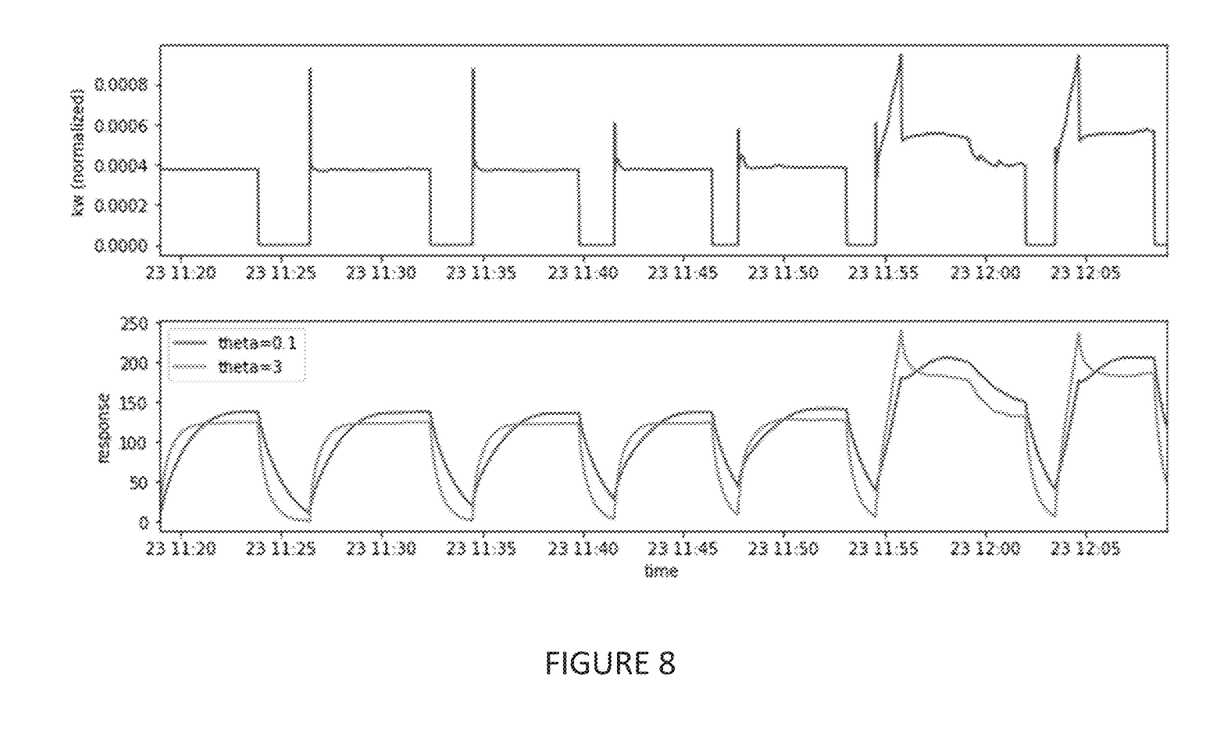
FIG. 8 illustrates the effect of varying the $\theta$ parameter on fault detection.
Figure 9A:
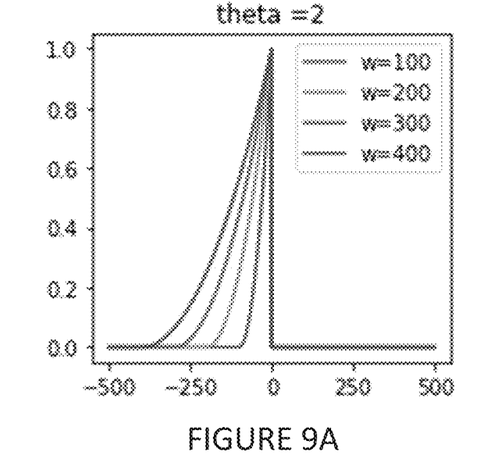
FIGS. 9A and 9B illustrate the effect of varying the $\theta$ parameter on the basis functions used for fault detection.
Figure 9B:
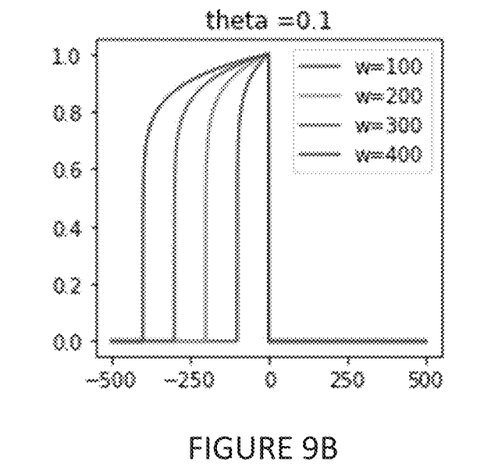

FIG. 8 illustrates the effects of varying $\theta$ on fault detection. The input consumption signal is shown in the top graph, with the intensity response in the lower graph for two distinct values of $\theta$. Inspection of the chart shows that $\theta=2$ in this case provides better detection of the fault as it produces a higher peak response value for the intensity function. In fact, $\theta=2$ yields a basis function that is very close to the shape of the consumption signal in FIG. 8 at the timestamp 11.55, as illustrated in FIG. 9A. By way of comparison, FIG. 9B illustrates the change in shape for $\theta=0.1$.

Processing System

Figure 10:
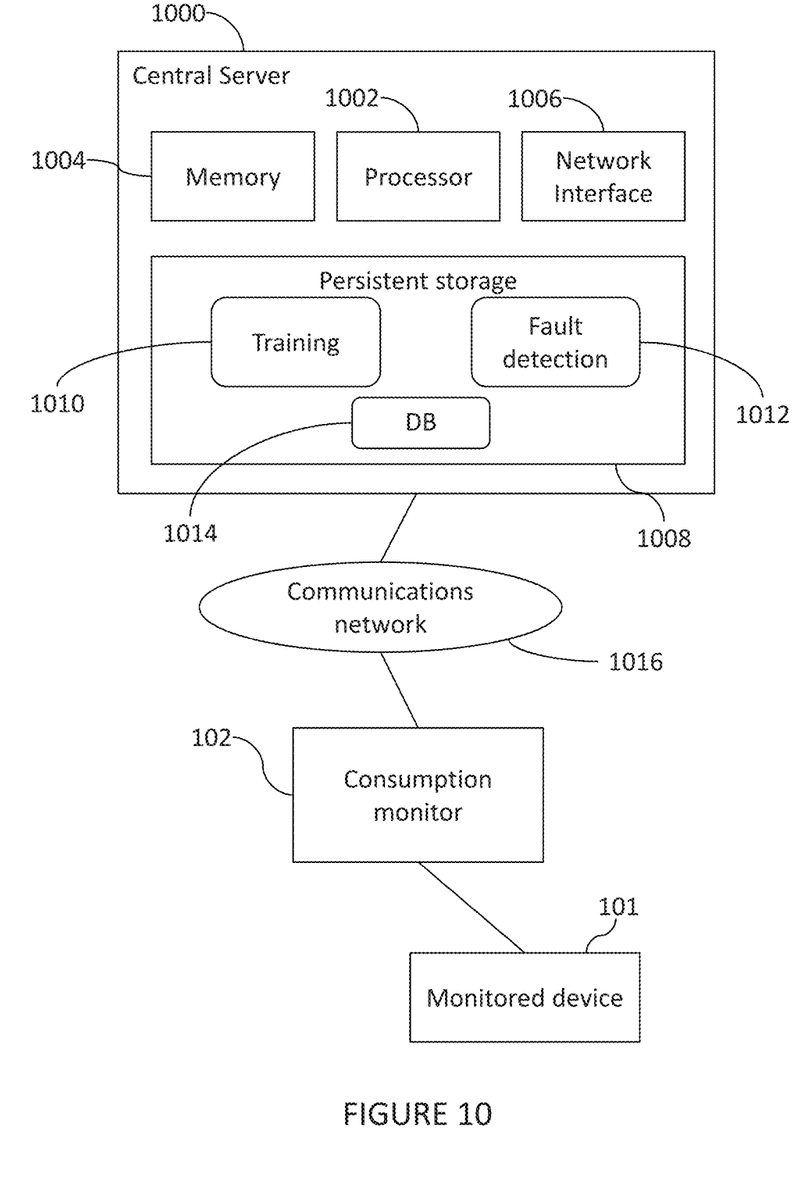
FIG. 10 illustrates a processing device for performing described detection algorithms.

FIG. 10 illustrates a processing system and device suitable for carrying out the disclosed fault detection methods.

The system includes a central data processing server 1000, e.g. in the form of a conventional server computer. The server includes one or more processors 1002 (e.g. standard Intel/AMD server processors) together with volatile/random access memory 1004 for storing temporary data and software code being executed.

A network interface 1006 is provided for communication with other system components, in particular consumption monitor 102, over one or more networks 1016 (e.g. Local or Wide Area Networks, including the Internet). The consumption monitor may be a current clamp or other monitoring device for monitoring electricity consumption of monitored device 101, which in the present example may be a boiler, air conditioner or other HVAC device or system. However, the described fault detection techniques are not limited to the HVAC context and can be applied to other types of appliances, devices, machines or systems. For example, the fault detection techniques could be applied to other home appliances such as washing machines, refrigerators or dishwashers.

In an alternative arrangement, a consumption monitoring function may be integrated into the device 101. In a further alternative, a consumption signal of a particular appliance or device may be extracted from a consumption measured for multiple appliances (e.g. for an entire house or other building, as measured by an energy meter) using disaggregation techniques.

Persistent storage 1008 (e.g. in the form of hard disk storage, optical storage and the like) persistently stores software and data, including a training software module 1010 for analysing consumption signals of healthy devices to establish comparison baselines (e.g. as per the FIG. 6 process) and a fault detection software module 1012 for detecting faults based on live consumption data and the established comparison baselines (e.g. as per the FIG. 7 process). A database 1014 is provided for storing data utilised in the system, such as fault types, basis functions, comparison baselines, detection criteria, consumption data being processed etc.

The persistent storage also includes other software and data (not shown), such as an operating system. Furthermore, the server will include other conventional hardware and software components as known to those skilled in the art, and the components are interconnected by data buses (e.g. in the form of a memory bus between memory 1004 and processor 1002, and an I/O bus between the processor 1002, network interface 1006 and a storage controller for persistent storage 1008 etc.)

While a specific architecture is shown by way of example, any appropriate hardware/software architecture may be employed. Furthermore, functional components indicated as separate may be combined and vice versa. For example, the functions of server 1000 may in practice be implemented by multiple separate processing devices. The server may be provided in the form of a cloud server or server cluster connected to multiple consumption monitors 102 over the Internet. In this way, the system may perform fault monitoring of large numbers of appliances and devices across many different houses or locations.

It will be understood that the present invention has been described above purely by way of example, and modification of detail can be made within the scope of the invention.

The invention claimed is:

1. A computer-implemented method of detecting a fault in a device, comprising:
    receiving an energy consumption signal for the device, the energy consumption signal indicating a varying energy consumption of the device over time during operation of the device;
    selecting at least one basis function from a database storing information defining a plurality of basis functions, wherein each basis function defines a signal pattern associated with a respective known fault type, each basis function having a shape which matches the shape of an expected consumption signal when the respective fault type is present;
    repeatedly determining a correlation between the at least one basis function and the energy consumption signal, while varying one or more parameters of the basis function, wherein determining the correlation comprises computing correlation values between a plurality of portions of the energy consumption signal and the basis function for each of a plurality of values of the one or more parameters;
    determining presence of an operating fault in the device in dependence on the determined correlation values; and
    generating an output based on the determination, wherein generating the output comprises one or more of:
    transmitting an electronic message to a user device indicating at least one of: presence of the fault, absence of the fault, and a detected fault type; and transmitting a control signal to the device or a control system associated with the device to change at least one of: an activation state of the device, an operating state of the device, and an operating configuration of the device.

2. A method according to claim 1, wherein the energy consumption signal comprises a time series of energy consumption values extending over a given time period, the evaluating step comprising evaluating a correlation between the basis function and the energy consumption signal at each of a plurality of times or time windows of the energy consumption signal.

3. A method according to claim 2, comprising computing a time series of intensity values, each intensity value indicative of a strength of correlation of the basis function to the energy consumption signal at a respective time or time window, wherein computing a time series of intensity values comprises computing a respective intensity value for each of a plurality of time instants based on a correlation of the basis function when centred at a respective time instant, wherein a width of the basis function defines a time window of the energy consumption signal over which correlation is evaluated.

4. A method according to claim 3, comprising:
analysing the intensity values to identify one or more intensity values meeting a detection criterion, wherein the detection criterion is based on comparison of the intensity values to a comparison threshold, the detection criterion comprising at least one intensity value exceeding the comparison threshold; and
in response to identifying one or more intensity values meeting the detection criterion, detecting an operating fault of the known fault type, or
in response to identifying no intensity values meeting the detection criterion, identifying that the fault is not present.

5. A method according to claim 1, wherein repeating the evaluation while varying one or more parameters of the basis function comprises varying each of the one or more parameters over a predefined set of parameter values or over a parameter range.

6. A method according to claim 1, wherein the one or more parameters comprise one or more of: a width parameter indicating a width of the basis function and/or signal window over which correlation is performed; and a shape parameter controlling a shape of the basis function.

7. A method according to claim 1, comprising at least one of:
computing at least one of: a representative correlation intensity, an average correlation intensity, and a maximum correlation intensity, over a range of variation of one or more basis function parameters; and
determining, for each of a plurality of values of a first parameter at least one of: a representative correlation intensity, an average correlation intensity, and a maximum correlation intensity, over a range of variation of a second parameter, wherein the first parameter is a shape parameter and the second parameter is a width parameter.

8. A method according to claim 1, comprising repeating the evaluation for each of a plurality of fault types, using one or more respective predetermined basis functions defined for each respective fault type, to detect presence or absence of each of the fault types, wherein the outputting step comprises, in response to detection of a given fault type based on correlation of a basis function associated with the given fault with the energy consumption signal, outputting an indication of the detected fault type.

9. A method according to claim 1, wherein evaluating a correlation between the at least one basis function and the energy consumption signal comprises computing one or more measures of correlation between the basis function and the energy consumption signal, and comparing the measure(s) against one or more comparison values, the comparison value(s) having been established based on energy consumption of a non-faulty device.

10. A method according to claim 1, further comprising establishing comparison values for use in performing the fault detection based on a reference energy consumption signal of a device operated in the absence of a fault.

11. A method according to claim 10, comprising, for a given fault type, or for each given fault type of a plurality of fault types:
evaluating a basis function associated with the given fault type against the reference energy consumption signal, by determining one or more correlation intensities indicating strength of correlation between the basis function and the reference energy consumption signal; and
determining a comparison value for the fault type based on the evaluation.

12. A method according to claim 11, wherein determining one or more correlation intensities comprises determining a time series of correlation intensities indicating strength of correlation between the basis function and the reference energy consumption signal at each of a plurality of times or time windows of the energy consumption signal, and comprising determining a comparison value based on the time series of correlation intensities, by selecting or computing a representative or maximum correlation intensity from the time series of correlation intensities.

13. A method according to claim 11, wherein evaluating a basis function against the reference energy consumption signal comprises varying one or more basis function parameters over predetermined parameter ranges to determine representative correlation intensities.

14. A method according to claim 11, wherein detection of a fault is performed based on comparing the comparison value obtained using the reference energy consumption signal to correlation intensities determined for the energy consumption signal.

15. A method according to claim 1, comprising receiving user input for configuring, for one or more fault types, one or more of:
at least one basis function suitable for detecting the fault type;
one or more ranges for one or more parameters of a basis function;
one or more limits for one or more parameters of a basis function; and
one or more detection criteria for the fault type;
and wherein the evaluation is performed in accordance with the configured information.

16. A method according to claim 1, wherein the energy consumption signal and/or reference energy consumption signal comprise electricity consumption signals, measured using an electricity consumption measurement device.

17. A non-transitory computer-readable medium comprising software code adapted, when executed on a processing device, to perform a method of detecting a fault in a device, comprising:

receiving an energy consumption signal for the device, the
energy consumption signal indicating a varying energy
consumption of the device over time during operation
of the device;

selecting at least one basis function from a database
storing information defining a plurality of basis functions, wherein each basis function defines a signal
pattern associated with a respective known fault type;
each basis function having a shape which matches the
shape of an expected consumption signal when the
respective fault type is present;

repeatedly determining a correlation between the at least
one basis function and the energy consumption signal
while varying one or more parameters of the basis
function, wherein determining the correlation comprises computing correlation values between a plurality
of portions of the energy consumption signal and the
basis function for each of a plurality of values of the
one or more parameters;

determining presence of an operating fault in the device in
dependence on the determined correlation values; and generating an output based on the determination, wherein
generating the output comprises one or more of:

transmitting an electronic message to a user device indicating at least one of: presence of the fault, absence of
the fault, and a detected fault type; and transmitting a control signal to the device or a control
system associated with the device to change at least one
of: an activation state of the device, an operating state
of the device, and an operating configuration of the
device.

18. A computer-implemented method of detecting a fault
in a device, comprising:

receiving an energy consumption signal for the device, the
energy consumption signal indicating a varying energy
consumption of the device over time during operation
of the device;

selecting a basis function from a database storing information defining a plurality of basis functions, each
basis function defining a signal pattern associated with
a respective known fault type, each basis function
having a shape which matches the shape of an expected
consumption signal when the respective fault type is
present; wherein the selected basis function comprises
a windowed function and is parameterized by at least
one parameter, the at least one parameter comprising
one or more of: a width parameter indicating a width of
the basis function and/or signal window over which
correlation is performed; and a shape parameter controlling the shape of the basis function;

evaluating a correlation between the basis function and
the energy consumption signal, wherein evaluating the
correlation comprises computing correlation values
between a plurality of portions of the energy consumption signal and the basis function for one or more values
of the at least one parameter;

determining presence of an operating fault in the device in
dependence on the correlation values; and generating an output based on the determination, wherein
generating the output comprises one or more of:

transmitting an electronic message to a user device indicating at least one of: presence of the fault, absence of
the fault, and a detected fault type; and transmitting a control signal to the device or a control
system associated with the device to change at least one
of: an activation state of the device, an operating state
of the device, and an operating configuration of the
device.

19. A method according to claim 18, wherein evaluating
the correlation comprises repeating the evaluation while
varying one or more of the parameters of the basis function,
each parameter varied over a respective predefined set of
parameter values.

* * * * *